United States Patent

Katayama et al.

[11] Patent Number: 5,848,075
[45] Date of Patent: Dec. 8, 1998

[54] TEST DEVICE EMPLOYING SCAN PATH HAVING CIRCUITRY AT SWITCHES BETWEEN A SCAN IN SIGNAL TRANSMITTED AND PREVIOUSLY HELD AT A PREDETERMINED CLOCK TIMING

[75] Inventors: Kunihiro Katayama; Tadashi Yoshikawa, both of Nara, Japan

[73] Assignee: Sharp Kabushiki Kaisha, Osaka, Japan

[21] Appl. No.: 772,850

[22] Filed: Dec. 24, 1996

[30] Foreign Application Priority Data

Mar. 13, 1996 [JP] Japan ................................... 8-055883

[51] Int. Cl.⁶ .................................................. G01R 31/28
[52] U.S. Cl. ..................................... 371/22.31; 371/22.36
[58] Field of Search ................................. 371/22.1, 22.31, 371/22.2, 22.36; 365/201, 205; 364/481, 550; 324/158.1, 76.11, 73.1

[56] References Cited

U.S. PATENT DOCUMENTS 4,692,633  9/1987  Ngai et al. ............................. 371/25.1
4,961,013  10/1990 Obermeyer, Jr. et al. ............. 371/22.3
5,150,366  9/1992  Bardell, Jr. et al. .................... 371/22.3

FOREIGN PATENT DOCUMENTS

6-160479  6/1994  Japan .

*Primary Examiner*—Hoa T. Nguyen

[57] ABSTRACT

A test device which employs a scan path method includes a latch circuit for holding a scan in signal, a transfer gate connected between the scan in signal and an input terminal of the latch circuit and having a gate terminal receiving a clock signal, a select circuit for selecting one of a data signal and an output signal from the latch circuit in response to a mode select signal and for outputting the selected signal, and a flipflop circuit for holding an output signal from the select circuit in response to the clock signal and for outputting the held signal as a scan out signal.

8 Claims, 9 Drawing Sheets

TEST DEVICE EMPLOYING SCAN PATH HAVING CIRCUITRY AT SWITCHES BETWEEN A SCAN IN SIGNAL TRANSMITTED AND PREVIOUSLY HELD AT A PREDETERMINED CLOCK TIMING

BACKGROUND OF THE INVENTION

1. Field of the Invention

The present invention relates to a test device for testing semiconductor integrated circuits. It particularly relates to a test device which employs a scan path method.

2. Description of the Background Art

Recently with the advance of higher density and multi-function logic LSI (Large Scale Integration), its integration degree has reached more than several ten thousands of gates. (Large number of logic circuits which are complicated combinations of sequential circuits such as flipflops and combinational circuits are incorporated in highly integrated logic LSI. However, the number of input/output terminals pins of logic LSI is at most several hundreds. Thus, it is very difficult to test all of the complicated circuits by inputting test patterns to the limited number of input terminals.

As a method of diagnosing logic LSI, scan path method has been proposed in which flipflops operable as a test circuit are connected in series and operated as a shift register to readily diagnose circuit defects.

The operation of a test device employing a conventional scan path method for testing semiconductor logic integrated circuits will now be described with reference to FIG. 1. The test device includes selectors 22a–22c and fliflops 23a–23c, receives a clock signal 24, a mode select signal 25, a data signal 26 and a scan in signal 27, and outputs an output signal 28. The test device is incorporated into logic LSI to test combinational circuits 21a and 21b. Signals which are input to data input terminals Ds of flipflops 23a–23c can be switched by selectors 22a–22c, respectively. For example, when mode select signal 25 is at the low level, data input terminals Ds of flipflops 23b and 23c receive output signals 29a and 29b of combinational circuits 21a and 21b, respectively (the normal mode of operation). On the other hand, when mode select signal 25 is set to the high level, flipflops 23a–23c function as a shift register and scan in signal 27 is sequentially shifted in flipflops 23a–23c in synchronization with clock signal 24 (the scan mode).

The operation of the test device in testing combinational circuits 21a and 21b will now be described. The test device is switched to the scan mode by setting mode select signal 25 to the high level, and test data from scan in signal 27 is sequentially stored in flipflops 23a–23c in synchronization with clock signal 24. Then, in order to operate combinational circuits 21a and 21b to be tested, mode select signal 25 is set to the low level to switch the test device to the normal mode of operation. Output signals 29a and 29b of combinational circuits 21a and 21b are input to the data input terminals Ds of flipflops 23b and 23c, respectively. The output signals 29a and 29b are stored in flipflops 23b and 23c, respectively, in synchronization with clock signal 24. Then, the test device is again switched to the scan mode and the clock signal is then input to flipflops 23a–23c to shift the data, and output signal 28 of the final stage is observed and compared with expected values so that testing of combinational circuits 21a and 21b for proper operation can be conducted.

Figure 2:
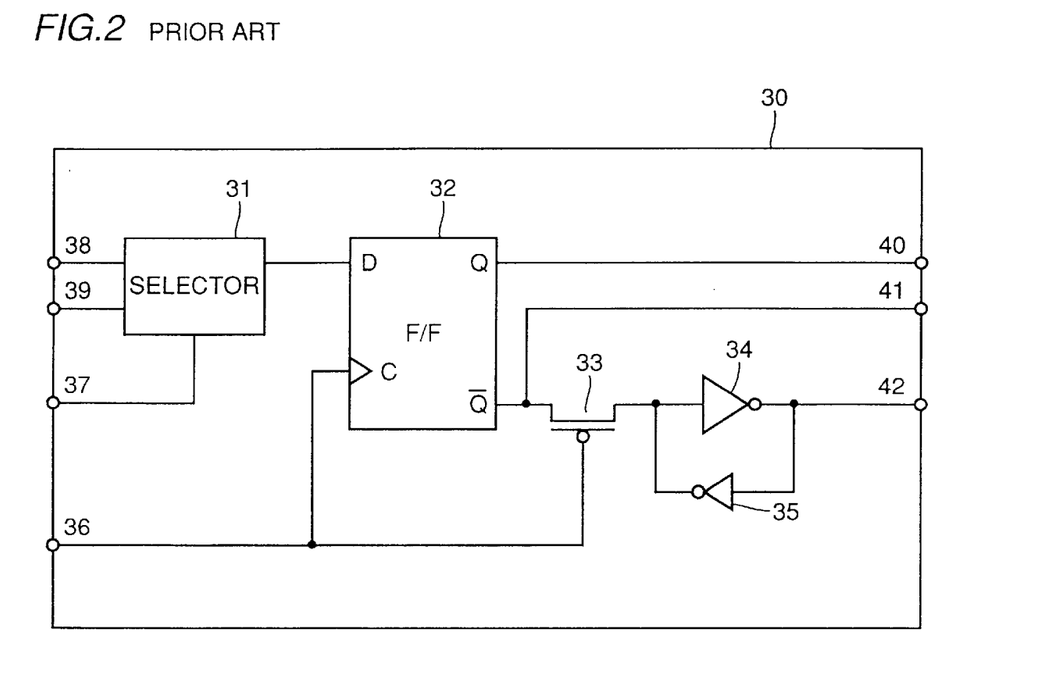
FIG. 2 shows another example of a conventional scan path test circuit.
Figure 3:
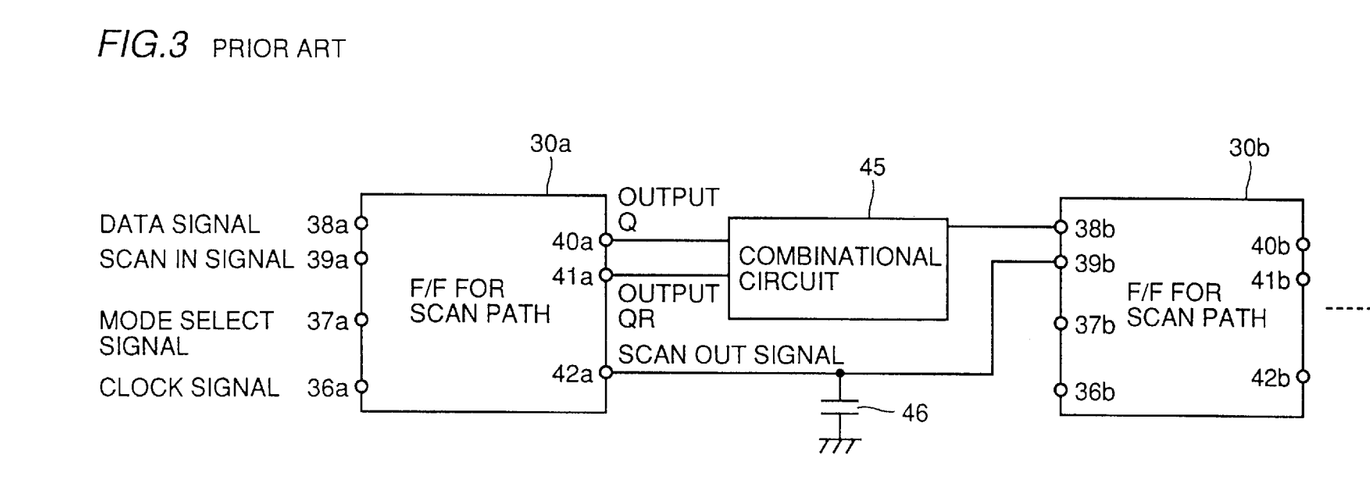
FIG. 3 shows an interconnection between the scan path test circuits shown in FIG. 2 and a combinational circuit.

FIG. 2 shows the configuration of a flipflop 30 for a scan path disclosed in Japanese Patent Laying-Open No. 6-160479. FIG. 3 shows a connection of a scan path test circuit which employs flipflop 30 for a scan path shown in FIG. 2. A combinational circuit 45 to be tested is connected between fliflops 30a and 30b for a scan path.

Referring to FIG. 2, flipflop 30 for a scan path includes a selector 31, a flipflop 32, a transfer gate 33 and inverters 34 and 35, and receives a clock signal 36, a mode select signal 37, a data signal 38 and a scan in signal 39 and outputs an output Q signal 40, an output QR signal 41 and a scan output signal 42. Referring to FIG. 3, an output Q signal 40a and an output QR signal 41a are input to combinational circuit 45. A scan out signal 42a is input as a scan in signal 39b for flipflop 30b for a scan path of the subsequent stage. The output of combinational circuit 45 is input as a data signal 38b for flipflop 30b for a scan path of the subsequent stage. The driving capability of an output terminal of inverter 35 shown in FIG. 2 is adapted to be sufficiently smaller than the output QR terminal of flipflop 32. Furthermore, flipflop 32 holds data in response to a change of clock signals 36 from the low level to the high level. Transfer gate 33 is turned on when clock signal 36 is set to the low level, and is turned off when clock signal 36 is set to the high level.

Transfer gate 33 is turned on by holding clock signal 36 at the low level. Since the driving capability of flipflop 32 is larger than that of inverter 35, an output Q signal, which is an inverted version of an output QR signal of flipflop 32, is output as scan out signal 42. Then, when clock signal 36 changes its level from low to high, flipflop 32 outputs the same value as the output signal of selector 31 at the output Q terminal and an inverted signal thereof to the output QR terminal. However, since transfer gate 33 is turned off simultaneously, the previous value is held on scan out signal 42. Furthermore, when clock signal 36 changes from the high level to the low level, transfer gate 33 is turned on, and an output Q signal, which is the inverted version of an output QR signal of flipflop 32, is output on scan out signal 42 due to the difference in driving capability between flipflop 32 and inverter 35.

Figure 1:
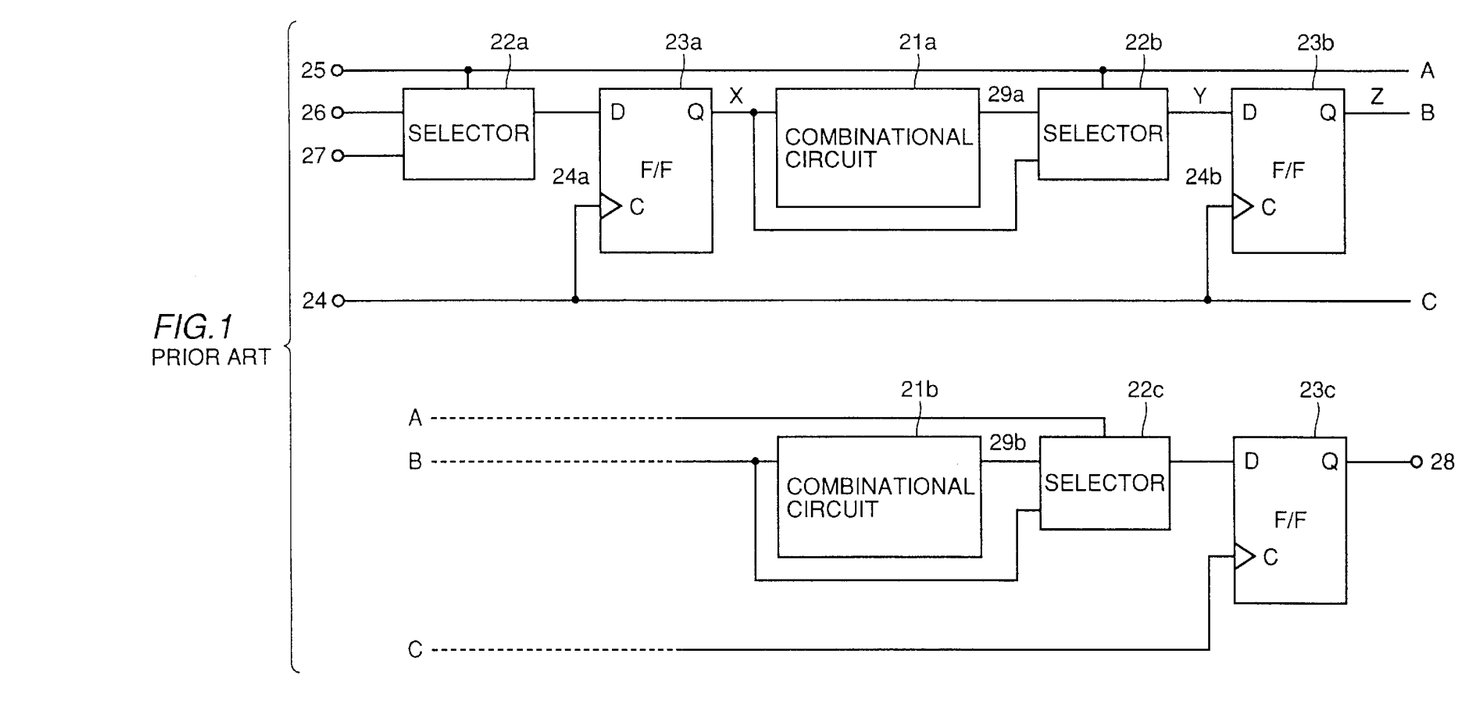
FIG. 1 shows an example of a conventional scan path test circuit.

In a test device employing the conventional scan path method shown in FIG. 1, the clock signal line for shift register operation can be rendered longer and complicated, and a buffer can be inserted to solve an insufficient driving capability of the clock signal. In this case, timing deviation (clock skew) is caused in clock signal inputs to flipflops and timings at which a clock signal is input to flipflops at their respective clock terminals deviate from one another in the scan mode so that normal shift register operation occasionally cannot be achieved.

The difference caused taken in the test device between the time in the normal mode of operation when transferring data between flipflops for a scan path and that in the scan mode will now be described. Generally, the delay time T in passing through n transistors is expressed by the following equation:

$$T = kRCn^2 \qquad (1)$$

wherein k represents a constant of proportion, and R and C represent resistance and capacitance per the unit length of interconnection, respectively.

As shown in FIG. 1, the output of flipflop 23a is input to flipflop 23b of the subsequent stage via selector 22b in the scan mode. As is apparent from equation (1), in the normal mode of operation, however, as combinational circuit 21a becomes more complicated, the number of elements between flipflop 23a and flipflop 23b of the subsequent stage is increased, so that a larger delay time will be observed in the normal mode of operation than in the scan mode.

Figure 4:
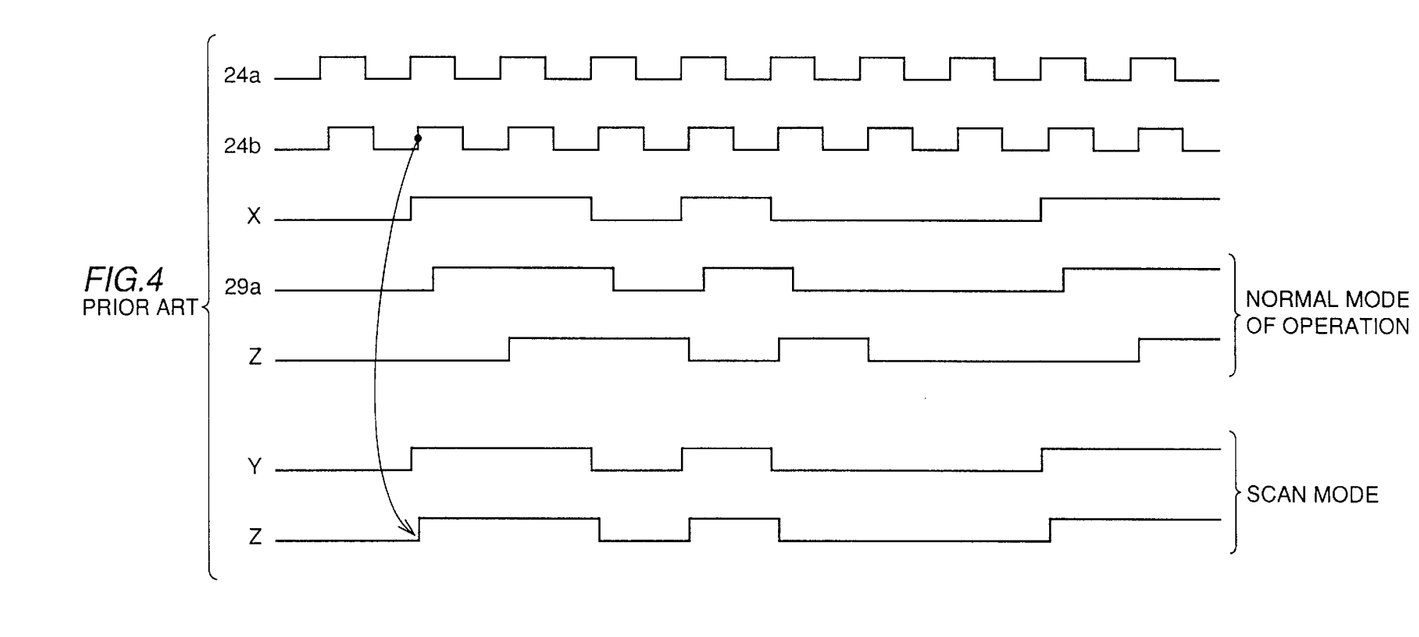
FIG. 4 is a flow chart for illustrating the operation of the scan path test circuit shown in FIG. 1.

Influence of clock skew will now be described with reference to the circuit diagram shown in FIG. 1 and the timing chart shown in FIG. 4. If the timing at which a clock signal 24b is input to flipflop 23b is slightly delayed from that at which a clock signal 24a is input to flipflop 23a of the preceding stage in the normal mode of operation, the delay of an output signal 29a from combinational circuit 21a is larger than the slight delay. Thus, flipflop 23a holds data at a rising of the clock and an output signal Z of flipflop 23b changes at the next rising of the clock. On the other hand, output Q (a signal X) of flipflop 23a which is output in synchronization with clock signal 24a input to flipflop 23a is transmitted to flipflop 23b of the subsequent stage almost free from delay in the scan mode (a signal Y) as compared with the normal mode of operation, as described above. Thus, the signal Y changes earlier than a rising of clock signal 24b and a signal Z which is output on the output Q terminal of flipflop 23b of the next stage is output one clock earlier so that normal shift register operation cannot be achieved.

Flipflop circuits for a scan path incorporated in logic LSI are originally incorporated as normal flipflop circuits, not as a shift register circuit for testing. Thus, it is very difficult to design the flipflop circuits allowing for clock skews so that the flipflop circuits properly operate as a shift register circuit for scan path testing while satisfactorily operating as flipflops as originally intended.

With the configuration of a flipflop for a scan path shown in FIG. 2, if a clock skew is caused in the scan mode, the clock skew does not cause any problems; since transfer gate 33 is turned off when clock signal 36 is at the high level, the previous value is held on scan out signal 42. However, with the final stage serving as a latch circuit, as a load capacitance connected thereto (a load capacitance of an interconnection capacitor 46 shown in FIG. 3) is increased, rising edges of the signal are rendered less sharp if the driving capability of inverter 34 is not increased, so that the correct value cannot be held. That is, since interconnection capacitance differs depending on the LSI, the driving capability of inverter 34 should be adjusted accordingly. Furthermore, since a flipflop circuit for a scan path has more output terminals than a normal flipflop, interconnection becomes more complicated, resulting in a disadvantage that the size of the chip is increased.

SUMMARY OF THE INVENTION

An object of the present invention is to provide a test device for a scan path capable of stable shift register operation and having a small number of terminals.

According to an aspect of the present invention, the test device includes: a latch circuit for holding a scan in signal; a transfer gate connected between the scan in signal and an input terminal of the latch circuit and having its gate terminal receiving a clock signal; a select circuit for selecting any of a data signal and an output signal from the latch circuit in response to a mode select signal and for outputting the selected signal; and a flipflop circuit for holding an output signal from the select circuit in response to the clock signal and for outputting the held signal as a scan out signal.

When the test device is switched to the scan mode by the mode select signal and when the clock signal is set to the high level, the scan in signal is output at an output terminal of the select circuit. The scan in signal output on the output terminal of the select circuit changes only immediately after a rising of the clock signal. Thus, if the flipflop circuit holds an output signal from the select circuit at a rising of the clock signal, the test device can achieve stable shift register operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 5:
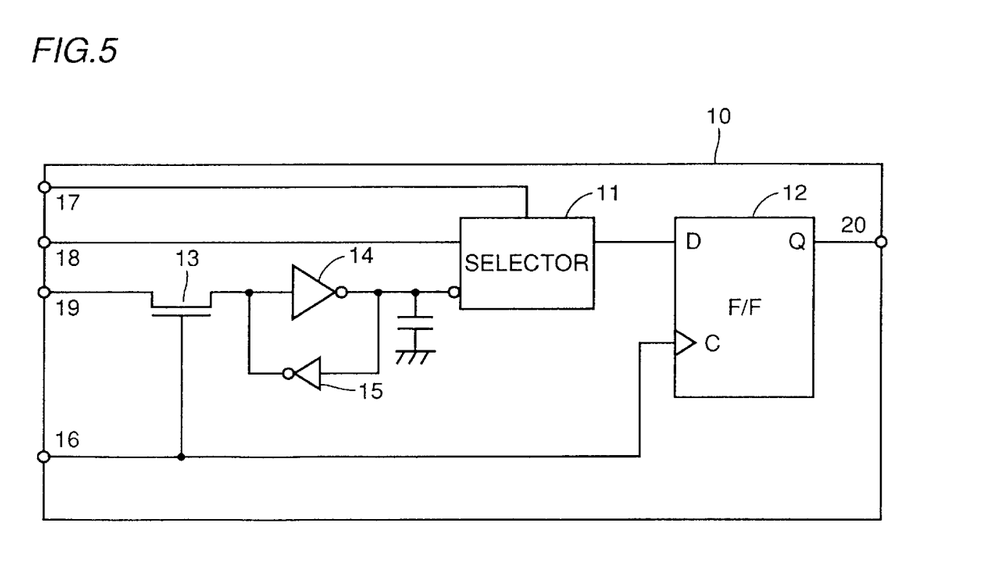
FIG. 5 shows an example of the test device according to the present invention.

Referring to FIG. 5, a flipflop 10 for a scan path includes a selector 11, a flipflop 12, a transfer gate 13 and inverters 14 and 15, receives a clock signal 16, a mode select signal 17, a data signal 18 and a scan in signal 19, and outputs an output Q signal 20.

Figure 6:
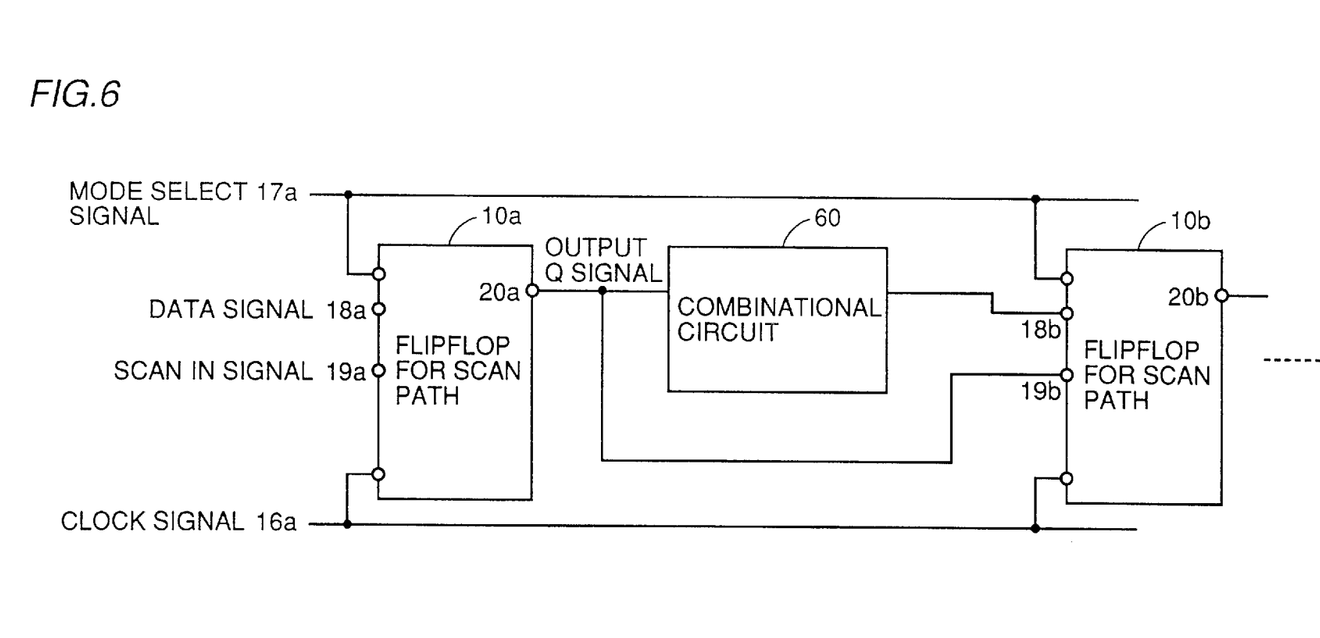
FIG. 6 shows an interconnection between the test device according to the present invention and a combinational circuit.

Referring to FIG. 6, an output Q signal 20a from a flipflop 10a for a scan path at the preceding stage is input to a combinational circuit 60. An output of combinational circuit 60 is input as a data signal 18b for a flipflop 10b for a scan path at the subsequent stage.

The driving capability of inverter 15 is adapted to be sufficiently small. Flipflop 12 is assumed to be an edge-triggered flipflop which holds data when clock signal 16 changes its level from low to high. Transfer gate 13 is adapted to be turned on when the clock signal is set to the high level and turned off when the clock signal is set to the low level.

Figure 7:
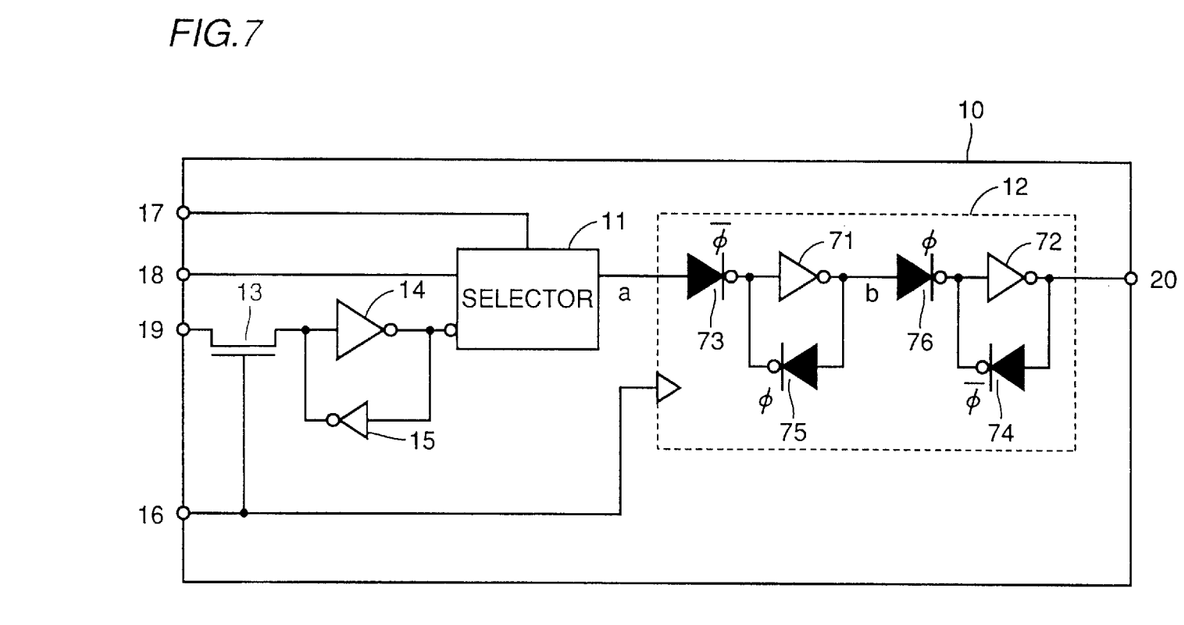
FIG. 7 shows in detail flipflop 12 in the test device shown in FIG. 5.

Referring to FIG. 7, flipflop 12 in flipflop 10 for a scan path includes inverters 71 and 72, clocked inverters 73 and 74 which output the inverted versions of input signals when the clock signal is at the low level, and clocked inverters 75 and 76 which output the inverted versions of input signals when the clock signal is at the high level.

Figure 8:
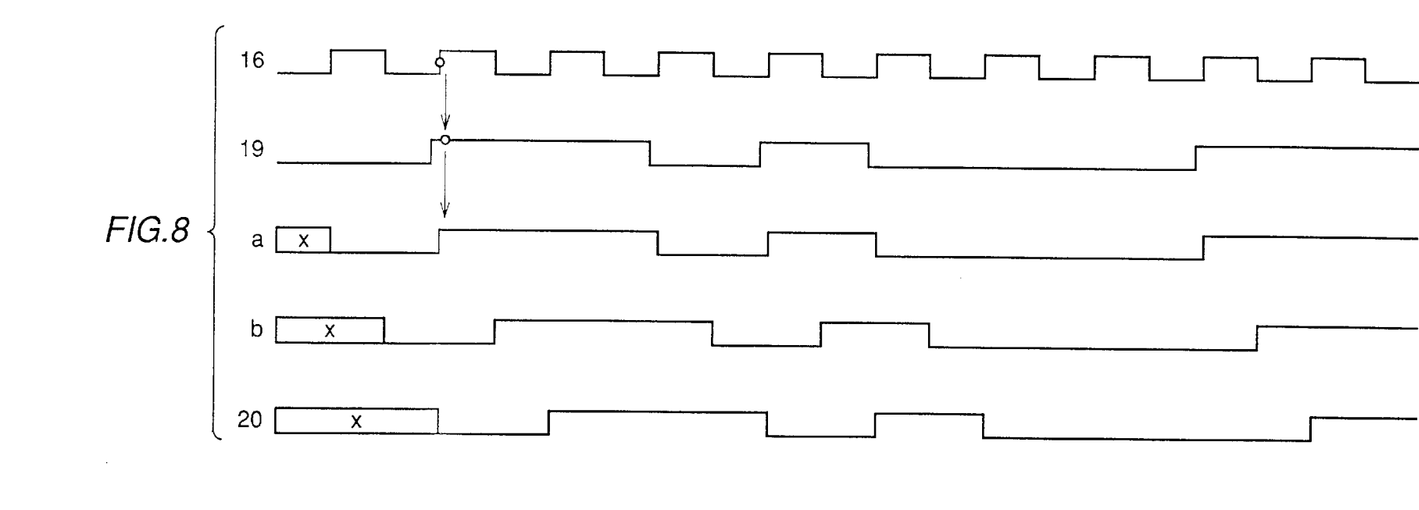
FIG. 8 is a flow chart for illustrating the operation of the test device according to the present invention when a rising of the clock signal is delayed from a changing point of the scan in signal.

FIG. 8 shows a timing chart when clock signal 16 is delayed from a clock which is input to a flipflop for a scan path at the preceding stage. In the normal mode of operation, an operation similar to that of the test circuit which employs a conventional scan path method is performed. Since an output Q signal 20 of the flipflop for a scan path at the preceding stage does not pass through the combination circuit in the scan mode, it is input to flipflop 10 for a scan path as a scan in signal 19 almost free from delay as compared with the normal mode of operation. This allows scan in signal 19 to be transmitted prior to rising of clock signal 16, as shown in FIG. 8. When scan in signal 19 changes, clock signal 16 is at the low level and thus transfer gate 13 is turned off. Accordingly, scan in signal 19 is not transferred to a point a corresponding to a data terminal D of flipflop 12 and inverters 14 and 15 invert outputs of each other to hold the previous value.

When clock signal 16 changes its level from low to high, transfer gate 13 is turned on. Since the driving capability of inverter 15 is sufficiently small, scan in signal 19 is transmitted to the point a. However, since clock inverter 73 inverts input signals when it is in the on state, the data at the point a is not transmitted to a point b and the previous value is held by inverter 71 and clocked inverter 75. When clock signal 16 is set to the low level, the data at the point a is transmitted to the point b. Between the point b and scan out terminal 20, data is cut off when clock signal 16 is at the low level and data is transmitted when clock signal 16 is at the high level. As shown in FIG. 8, scan in signal 19 changes at rising of the clock and scan out signal 20 changes at the next rising of the clock so that shift register operation is ensured.

Figure 9:
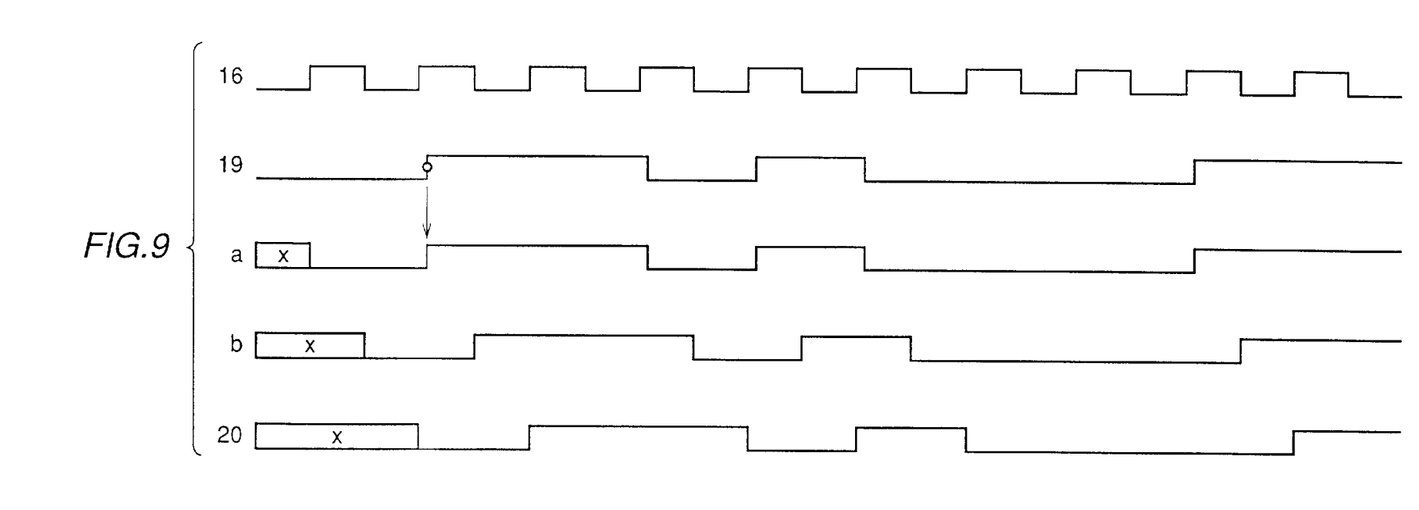
FIG. 9 is a flow chart for illustrating the operation of the test device according to the present invention when rising of the clock signal precedes a changing point of the scan in signal.

FIG. 9 shows the timing chart when clock signal 16 precedes a clock signal which is input to the flipflop for a scan path at the preceding stage. In this case, clock signal 16 is being held at the high level when scan in signal 19 is transmitted, so that scan in signal 19 is transmitted to the point a. However, since clocked inverter 73 inverts input signals when it is in the on state, the data at the point a is not transmitted to the point b and the previous value is maintained by inverter 71 and clocked inverter 75. When clock signal 16 is set to the low level, the data at the point a is transmitted to the point b. Between the point b and scan out terminal 20, data is cut off when clock signal 16 is at the low level and data is transmitted when clock signal 16 is at the high level. Thus, as shown in FIG. 9, scan in signal 19 changes at rising of the clock and scan out signal 20 changes at the next rising of the clock, so that shift register operation is ensured.

With the scan path configuration according to the present invention, it is almost unnecessary to consider the problem of clock skews in the scan mode in a test device which employs a scan path method (deviation less than half a clock period is tolerable) and this simplifies the designing of the test circuit. Furthermore, the test device can be used as conventional flipflops in the normal mode of operation.

As described above, the present invention effectively simplifies the designing of the clock signal of a test device which employs a scan path method without considering problems such as clock skews, by adding a transfer gate and a latch circuit to a flipflop for a scan path serving as the basic circuit for testing employing a scan path method. Furthermore, since a load capacitance connected to an inverter is predetermined, an optimal flipflop for a scan path can always be configured. Furthermore, since the device has only one output terminal, interconnection is simplified and the size of the chip can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A test device comprising:

a latch circuit for holding a scan in signal;

a transfer gate connected between said scan in signal and an input terminal of said latch circuit and having a gate terminal receiving a clock signal;

a select circuit for selecting one of a data signal and an output signal from said latch circuit in response to a mode select signal and for outputting a selected signal; and a flipflop circuit for holding an output signal from said select circuit in response to the clock signal and for outputting the held signal as a scan out signal.

2. The test device according to claim 1, further comprising:

first and second clocked inverters for inverting first input signals and conducting said inverted first input signals when said clock signal is set to a low level;

third and fourth clocked inverters for inverting second input signals and conducting said inverted second input signals when said clock signal is set to a high level; and first and second inverters; wherein the output terminal of said select circuit is connected to an input terminal of said first clocked inverter, the output terminal of said first clocked inverter is connected to an input terminal of said first inverter and an output terminal of said third clocked inverter, an output terminal of said first inverter is connected to an input terminal of said third clocked inverter and an input terminal of said fourth clocked inverter, an output terminal of said fourth clocked inverter is connected to an input terminal of said second inverter and an output terminal of said second clocked inverter, and an output terminal of said second inverter is connected to an input terminal of said second clocked inverter and said scan out signal.

3. The test device according to claim 1, wherein the latch circuit further comprises first and second latch inverters, the output terminal of the transfer gate connected to an input terminal of the first latch inverter, the output terminal of the first latch inverter connected to an input terminal of the second latch inverter and an input terminal of the select circuit, and an output terminal of the second latch inverter connected to an input terminal of the first latch inverter.

4. The test device according to claim 1, further comprising a load capacitor connected between the latch circuit and the select circuit.

5. A method for testing semiconductor integrated circuits, comprising:

holding a scan in signal with a latch circuit;

connecting a transfer gate between the scan in signal and an input terminal of the latch circuit;

receiving a clock signal with a gate terminal of the transfer gate;

selecting one of a data signal and an output signal from the latch circuit with a select circuit in response to a mode select signal as a selected signal;

outputting the selected signal;

holding the selected signal with a flipflop circuit in response to the clock signal; and outputting the held selected signal as a scan out signal with the flipflop circuit.

6. The method of claim 1, further comprising:

inverting first input signals and conducting the inverted first input signals with first and second clocked inverters when the clock signal is set to a low level;

inverting second input signals and conducting the inverted second input signals with third and fourth clocked inverters when the clock signal is set to a high level;

connecting an output terminal of the select circuit to an input terminal of the first clocked inverter;

connecting the output terminal of the first clocked inverter to an input terminal of a first inverter and an output terminal of the third clocked inverter;

connecting an output terminal of the first inverter to an input terminal of the third clocked inverter and an input terminal of the fourth clocked inverter;

connecting an output terminal of the fourth clocked inverter to an input terminal of a second inverter and an output terminal of the second clocked inverter; and connecting an outputer terminal of the second inverter to an input terminal of the second clocked inverter and the scan out signal.

7. The method of claim 5, further comprising:

connecting the output terminal of the transfer gate to an input terminal of a first latch inverter of the latch circuit;

connecting the output terminal of the first latch inverter to an input terminal of a second latch inverter of the latch circuit and an input terminal of the select circuit; and connecting an output terminal of the second latch inverter to an input terminal of the first latch inverter.

8. The method of claim 5, further comprising connecting a load capacitor between the latch circuit and the select circuit.

* * * * *